United States Patent
Koschan et al.

(10) Patent No.: US 8,617,422 B2
(45) Date of Patent: Dec. 31, 2013

(54) USE OF CODOPING TO MODIFY THE SCINTILLATION PROPERTIES OF INORGANIC SCINTILLATORS DOPED WITH TRIVALENT ACTIVATORS

(75) Inventors: Merry Anna Koschan, Maryville, TN (US); Charles L. Melcher, Oak Ridge, TN (US); Lars A. Erikkson, Oak Ridge, TN (US); Harold E. Rothfuss, Knoxville, TN (US)

(73) Assignees: Siemens Medical Solutions USA, Inc., Malvern, PA (US); University of Tennessee Research Foundation, Knoxville, TN (US)

( * ) Notice: Subject to any disclaimer, the term of this patent is extended or adjusted under 35 U.S.C. 154(b) by 155 days.

(21) Appl. No.: 12/568,063

(22) Filed: Sep. 28, 2009

(65) Prior Publication Data
US 2010/0078595 A1 Apr. 1, 2010

Related U.S. Application Data

(60) Provisional application No. 61/100,332, filed on Sep. 26, 2008.

(51) Int. Cl.
*C09K 11/02* (2006.01)

(52) U.S. Cl.
USPC .................................................. 252/301.4 F

(58) Field of Classification Search
USPC .................. 252/301.4 F, 301.6 R, 301.17; 250/370.11, 483.1
See application file for complete search history.

(56) References Cited

U.S. PATENT DOCUMENTS

| | | | |
|---|---|---|---|
| 6,278,832 B1 | 8/2001 | Zagumennyi et al. | |
| 6,689,293 B2 * | 2/2004 | McClellan et al. | 252/301.4 F |
| 7,132,060 B2 | 11/2006 | Zagumennyi et al. | |
| 8,062,419 B1 * | 11/2011 | Andreaco et al. | 117/13 |
| 2004/0104363 A1 * | 6/2004 | Suzuki | 250/584 |
| 2006/0086311 A1 * | 4/2006 | Zagumennyi et al. | 117/13 |
| 2006/0288926 A1 * | 12/2006 | Kurata et al. | 117/16 |
| 2007/0209581 A1 * | 9/2007 | Ferrand et al. | 117/942 |
| 2008/0213151 A1 | 9/2008 | Yoshikawa et al. | |

FOREIGN PATENT DOCUMENTS

WO WO 2005028590 A1 * 3/2005

OTHER PUBLICATIONS

Spurrier et al. 'The effect of co-doping on growth stability and scintillation properties of lutetium oxyorthosilicate', Nov. 6, 2007, Journal of Crystal Growth 310, pp. 2110-2114.*

Zavartsev et al. Czochralski growth and characterisation of large Ce3+:Lu2SiO5 single crystals co-doped with Mg2+ or Ca2+ or Tb3+ for scintillators, Jan. 1, 2005, Journal of Crystal Growth 275, pp. 2167-2171.*

Jacquemet, M., et al., "Efficient laser action of Yb:LSO and Yb:YSO oxyorthosilicates crystals under high-power diode-pumping", Applied Physics B 80, 171-176 (2005).

(Continued)

*Primary Examiner* — Emily Le
*Assistant Examiner* — Lynne Edmondson
(74) *Attorney, Agent, or Firm* — Peter Kendall

(57) ABSTRACT

Crystals with improved scintillation and optical properties are achieved by codoping with a trivalent dopant and a divalent and/or a monovalent dopant. Embodiments include codoping LSO, YSO, GSO crystals and LYSO, LGSO, and LYGSO crystals. Embodiments also include codoped crystals with a controlled monovalent or divalent:trivalent dopant ratio of from about 1:1 for increased light yield to about 4:1 for faster decay time.

15 Claims, 8 Drawing Sheets

(56) References Cited

OTHER PUBLICATIONS

Rothfuss, et al., "The Effect of Ca2+ Codoping on Shallow Traps in YSO:Ce Scintillators", IEEE Transactions on Nuclear Science, Vol. 56, No. 3, Jun. 2009.
Rothfuss, et al., "Codoping YSO: Ce with Calcium to Improve Fundamental Properties", University of Tennessee.
Yang, et al "The effect of calcium co-doping on praseodymium doped LSO", 2008 Symposium on Radiation Measurements and Applications, Jun. 2-5, 2008, Berkeley, California, USA.
Spurrier, et al., "The effect of co-doping on the gowth stability and scintillaton properties of lutetium oxyorthosilicate", ScienceDirect, Journal of Crystal Growth 310 (2008) 2110-2114.
Spurrier, et al., "Effects of Ca2+ Co-Doping on the Scintillation Properties of LSO:Ce", IEEE Transactions on Nuclear Science, vol. 55, No. 3, Jun. 2008.
Thibault, et al, Efficient diode-pumped Yb3+: Y2SiO5 and Yb3+:Lu2SiO5 high-power femtosecond laser operation, Optics Letters, May 15, 2006/vol. 31, No. 10.
Yang, et al., The Effect of Calcium Co-Doping on Praseodymium Doped LSO, IEEE Transactions on Nuclear Science, vol. 56, No. 3, Jun. 2009.
Zavartsev, et al., "Czochralski Growth and Characterisation of Large Ce3+:Lu2SiO5 Single Crystals Co-doped with Mg2+ or Ca2+ or Tb3+ for Scintillators", Journal of Crystal Growth 275 (2005) e2167-e2171.

\* cited by examiner

USE OF CODOPING TO MODIFY THE SCINTILLATION PROPERTIES OF INORGANIC SCINTILLATORS DOPED WITH TRIVALENT ACTIVATORS

CROSS-REFERENCE TO RELATED APPLICATIONS AND CLAIM FOR PRIORITY

This application is a non-provisional of, and claims priority under 35 U.S.C. §119(e) from, provisional application Ser. No. 61/100,332, filed Sep. 26, 2008, entitled Use Of Codoping To Modify The Scintillation Properties Of Inorganic Scintillators Doped With Trivalent Activators, and provisional application Ser. No. 61/100,328, filed Sep. 26, 2008, entitled Codoping YSO:Ce With Calcium To Improve Fundamental Properties. This application is also a continuation-in-part of U.S. patent application Ser. No. 11/842,813, entitled Lutetium Oxyorthosilicate Scintillator Having Improved Scintillation and Optical Properties and Method of Making the Same, filed on Aug. 21, 2007, the entire disclosure of which is incorporated herein by reference into the present application.

TECHNICAL FIELD

The present disclosure relates to crystal materials with improved scintillation and optical characteristics. The present disclosure is applicable to inorganic scintillation crystal materials, such as oxyorthosilicates ($Ln_2SiO_5$) where Ln is Lutetium (Lu), Yttrium (Y), and/or Gadolinium (Gd), i.e., LSO, YSO, GSO, LYSO, LGSO, and (LYGSO.

BACKGROUND

Scintillation detectors are used in a wide variety of applications, including medical diagnostics and therapy (PET, SPECT, therapy imaging, etc.), oil exploration, field spectrometry, and container and baggage scanning. Desirable properties for scintillation detectors include high light output (i.e., a high efficiency for converting the energy of incident radiation into scintillation photons), efficient detection of the radiation being studied, a high stopping power, good linearity over a wide range of energy, a short rise time for fast timing applications, and a short decay time to reduce detector deadtime and accommodate high event rates. Light output is particularly important, as it affects both the efficiency and resolution of the detector, where efficiency is the ratio of detected particles to the total number of particles impinging upon the detector, and energy resolution is the ratio of the full width at half maximum of a given energy peak to the peak position, usually expressed in percent. The light output is often quantified as a number of scintillation photons produced per MeV of deposited energy.

LSO is a scintillation crystal that is widely used in medical imaging applications, such as for gamma-ray detection in Positron Emission Tomography (PET). LSO is typically doped with 0.05 to 0.5% cerium (Ce), while controlling other impurities at low levels. The light yield of Ce doped LSO (Ce:LSO) crystals grown using prior art methods is on average significantly lower than the theoretical maximum, and the decay time of these crystals tends to be in the 40 ns range. In addition, new techniques for image data acquisition require faster decay times than those obtained with Ce:LSO. Further, scintillation properties of LSO grown under such conditions can vary significantly from boule to boule, and in different parts of the same boule, which consequently increases the cost of commercial crystal production caused by the large number of out-of-spec crystals produced.

Work has been done with codoping the LSO crystals in an attempt to improve the scintillation properties. For example, Ce:LSO has been doped with 0.02% calcium (Ca) or magnesium (Mg). However, although codoping improved light yield some, it failed to change decay time for the crystals.

A need therefore exists for scintillation crystals with improved light yield and light yield uniformity, controllable scintillation decay time that can be optimized for specific applications, and improved decay time uniformity. A need also exists for production techniques with improved yield by reducing the number of out-of-spec crystals produced.

SUMMARY

An aspect of the present disclosure is a crystal exhibiting increased light output and reduced decay times.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a crystal comprising: $T_{2x}Lu_{2(1-x-y-z)}Y_{2y}Gd_{2z}SiO_5$ and at least one monovalent and/or divalent codopant, wherein T comprises at least one trivalent dopant, $0 < 2x < 0.2$, $0 \leq 2y \leq 2(1-x)$, $0 \leq 2z \leq 2(1-x)$, and $0 \leq (y+z) \leq (1-x)$.

Aspects include a crystal having a ratio (a):(b) of the divalent dopant concentration (a) to a trivalent dopant concentration (b) of about 1:20 to about 20:1, for example about 1:1, to maximize light output, or about 4:1 to about 6:1, e.g., about 4:1 to about 5:1, to minimize decay times. The concentrations are with respect to initial starting raw materials; due to varying segregation coefficients in melt grown crystals the ratio in the finished crystals could differ. A further aspect includes crystals doped with a trivalent activator comprising Ce, Pr, Eu. Er, or Yb, e.g. Ce. Another aspect includes crystals codoped with Na, K, Mg, Ca, Ba, Zn, or Cu, e.g. Ca. Other aspects include a medical imaging device such as a positron emission tomography scanner, a laser device, an oil exploration device, an optical data storage device, or a scintillation detector, and use thereof, comprising the codoped crystal.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses the issues of low light output and slow decay time in a scintillation crystal. In accordance with embodiments of the present disclosure, a crystal is doped with both a trivalent dopant and a monovalent and/or divalent codopant. By controlling the ratio (a):(b) of the codopant concentration (a) to the trivalent dopant concentration (b) for a particular situation, the light yield and decay times can be improved and optimized. In addition, the use of the codopant improves production yield.

Embodiments of the present disclosure include a crystal with the chemical formula $T_{2x}Lu_{2(1-x-y-z)}Y_{2y}Gd_{2z}SiO_5$ and at least one monovalent and/or divalent codopant, wherein T comprises at least one trivalent dopant, $0<2x<0.2$, $0\leq 2y\leq 2(1-x)$, $0\leq 2z\leq 2(1-x)$, and $0\leq (y+z)\leq (1-x)$. The trivalent dopant comprises, for example, Ce, Pr, Eu, Er, or Yb, and the monovalent and/or divalent codopant(s) comprise, for example, Na, K, Mg, Ca, Ba, Zn, or Cu. The concentrations of the codopant (a) and the trivalent dopant (b) are controlled such that a ratio of (a):(b) ranges from about 1:20 to about 20:1. For higher light output the ratio (a):(b) may be about 1:1, whereas for shorter decay times, the ratio (a):(b) may be about 4:1 to about 6:1, for example about 4:1 to about 5:1. The concentrations are with respect to initial starting raw materials; due to varying segregation coefficients in melt grown crystals the ratio in the finished crystals could differ. The crystal may be a part of a medical imaging device, such as a positron emission tomography (PET) scanner, a laser device, an oil exploration device, or an optical data storage device.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Crystals according to exemplary embodiments of the disclosure may be grown by the Czochralski method. However, single crystals or polycrystalline materials or ceramics grown or produced by other methods may also be employed.

Figure 1:
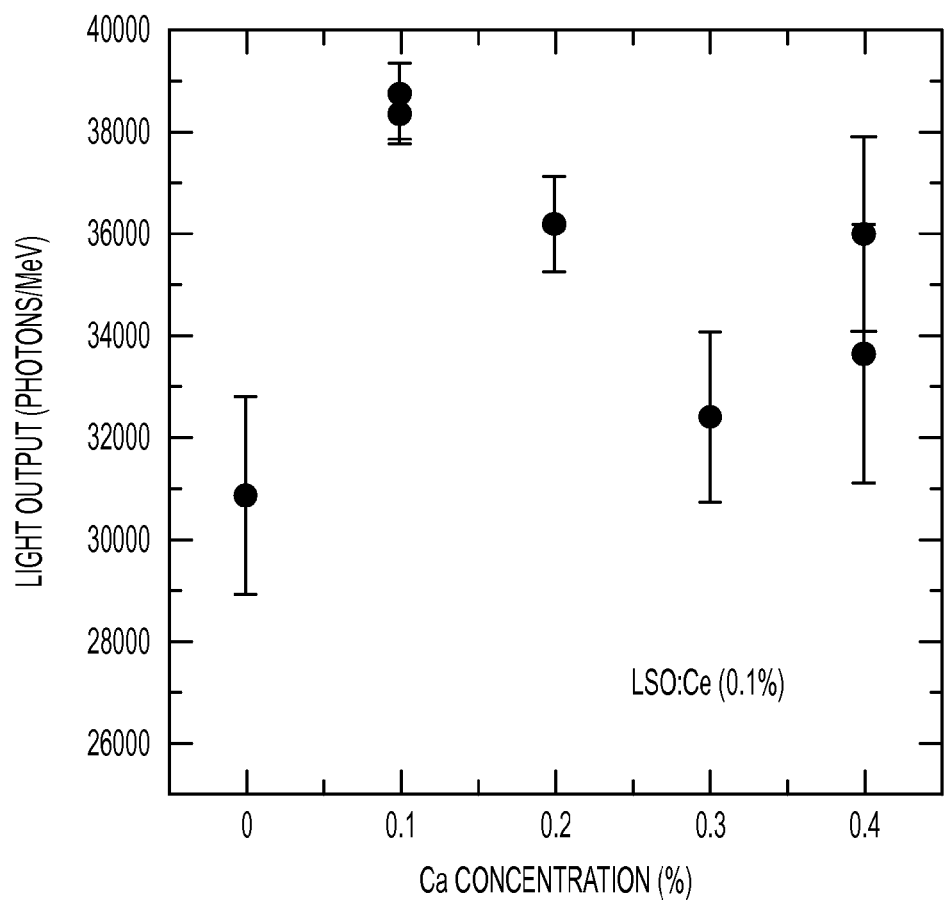
FIG. 1 graphically illustrates light yield for a Ce:LSO crystal as a function of $Ca^{2+}$ concentration.

FIG. 1 graphically illustrates light yield for a Ce:LSO crystal as a function of $Ca^{2+}$ concentration. The amount of Ce in each sample was 0.1 atomic (at.) % (where at. % refers to the concentration in starting raw materials with respect to lutetium (Lu)). The Ca doped crystals had up to 25% more light output when compared to the high quality Ce-only reference crystal. The best light yield was obtained for 0.1% Ca with the light yield decreasing gradually for crystals with higher Ca concentrations. The error bars represent the standard deviation of the individual samples within a boule. Repeatability of measurements on a single sample is about 3%.

Figure 2:
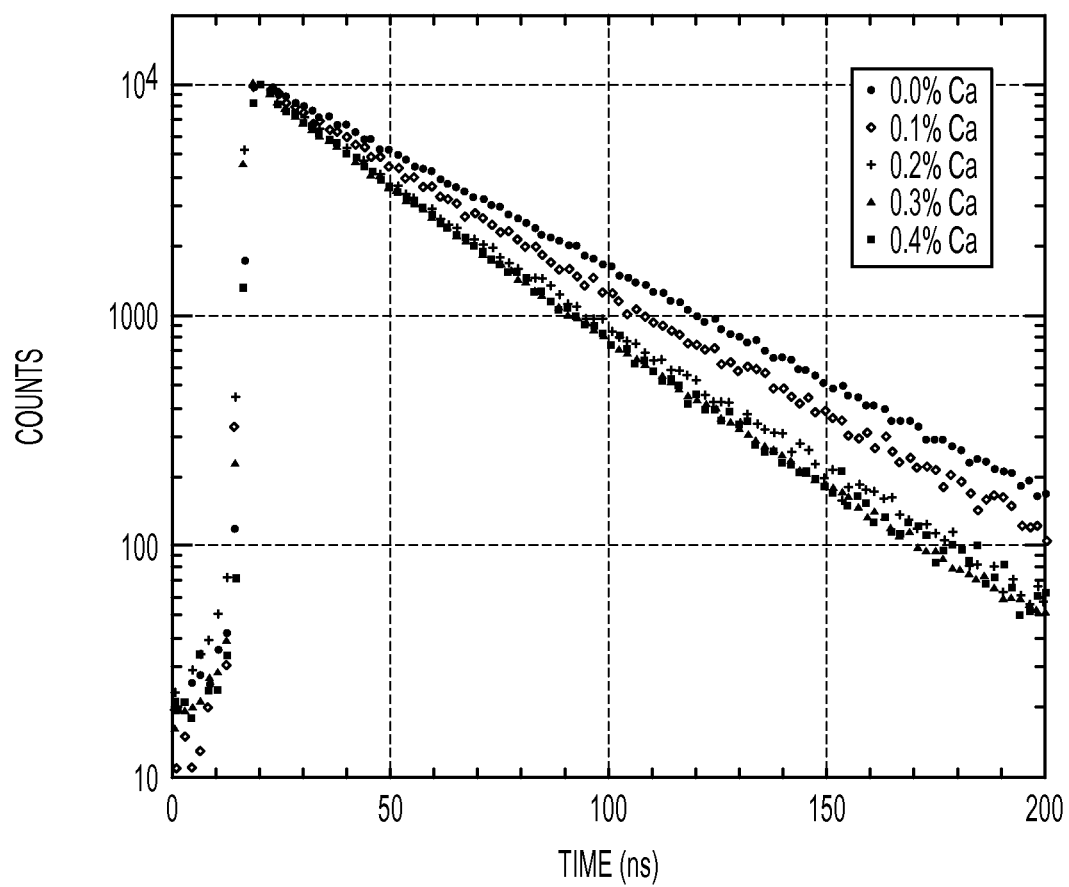
FIG. 2 graphically illustrates decay time measurements for Ca doped Ce:LSO crystals.
Figure 3:
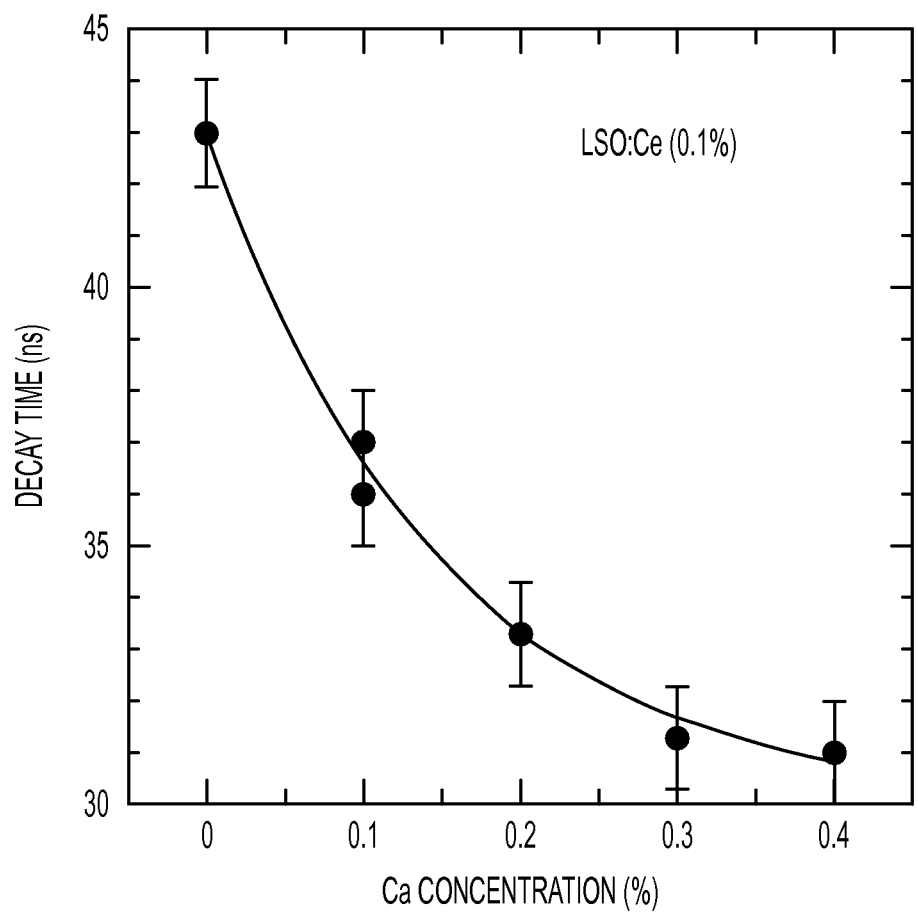
FIG. 3 shows how the decay constant decreases monotonically with increasing Ca concentration.

Decay time measurements for the Ca doped crystals are graphically illustrated in FIG. 2. The decay of each crystal can be characterized by a single exponential decay, although it is clear that the Ca doped crystals have significantly faster decay compared to LSO doped only with Ce. FIG. 3 shows how the decay constant decreases monotonically with increasing Ca concentration. Each point represents the average of multiple samples from a boule with a given Ca concentration. The error bars represent the standard deviation (about 1 ns) of the individual samples within a boule. Repeatability of measurements on a single sample is about 0.5 ns. Crystals with about 0.3 to about 0.4% Ca have the fastest decay time of about 31 ns compared to 43 ns for LSO doped only with Ce.

The relationship between decay time and light yield for Ca doped crystals is illustrated in Table 1. Light output and decay time values in Table 1 represent the average of multiple samples.

TABLE 1

PROPERTIES OF LSO:CE,CA CRYSTALS

| Ca concentration (%) | Light output (photons/MeV) | Decay time (ns) |
|---|---|---|
| 0.0 | 30900 | 43.0 |
| 0.1 | 38800 | 36.7 |
| 0.2 | 36200 | 33.3 |
| 0.3 | 32400 | 31.3 |
| 0.4 | 34800 | 31.0 |

A correlation is apparent in which the decay time becomes faster with decreasing light yield. The Ca doped crystals with the fastest decay time (31 ns) have light output higher than that of the reference crystal that has a decay time of 43 ns.

In the above example, the concentration of Ce in the samples was 0.1%, and the ratio of Ca to Ce (excluding the reference sample) ranged from about 1:1 to about 4:1. The amount of Ce may range widely, for example from about 0.01 to about 1%. As evident from Table 1, any concentration of Ca raised the light output and decreased the decay time relative to the reference crystal with no Ca. Accordingly, embodiments of the disclosure include amounts of Ca greater than 0%. However, the light output peaked at about a 1:1 ratio of Ca to Ce and the decay time was fastest around a 4:1 ratio. It has been found that it is not the absolute concentration of Ca, but rather the ratio of Ca to Ce that determines the decay time and light yield. The ratio of Ca to Ce should range from about 1:20 to about 20:1, for improved light output and decay time, but for example about 1:1 for highest light output or about 4:1 to about 6:1, such as 4:1 to about 5:1, for fastest decay times. The concentrations are with respect to initial starting raw materials: due to varying segregation coefficients in melt grown crystals the ratio in the finished crystals could differ. By manipulating the relative concentrations of Ca and Ce, it is possible to pre-select the decay time of the finished crystals within a range of about 28 to about 43 ns, with the shortest decay times being achieved by the highest ratio.

Although Table 1 shows the relationship between Cu concentration, decay time, and light yield, additional or other divalent and/or monovalent co-dopants may also be used, for example sodium (Na), potassium (K), magnesium (Mg), barium (Ba), zinc (Zn), or copper (Cu), and other similar elements.

The focus has been on Ce:LSO. However, YSO ($Y_2SiO_5$), and, GSO ($Gd_2SiO_5$) are both similar in structure and properties to LSO. In actuality, the crystal may be characterized by the formula $T_{2x}Lu_{2(1-x-y-z)}Y_{2y}Gd_{2z}SiO_5$ and at least one monovalent and/or divalent codopant, wherein T comprises at least one trivalent dopant, $0<2x<0.2$, $0\leq 2y\leq 2(1-x)$, $0\leq 2z\leq 2(1-x)$, and $0\leq(y+z)\leq(1-x)$. While there are some fundamental variations in properties, such as density, thermal response, scintillation light yield, and decay time, that may make one type of crystal more suitable than another for specific applications, they are sufficiently similar to consider them to be substantially interchangeable.

Figure 4A:
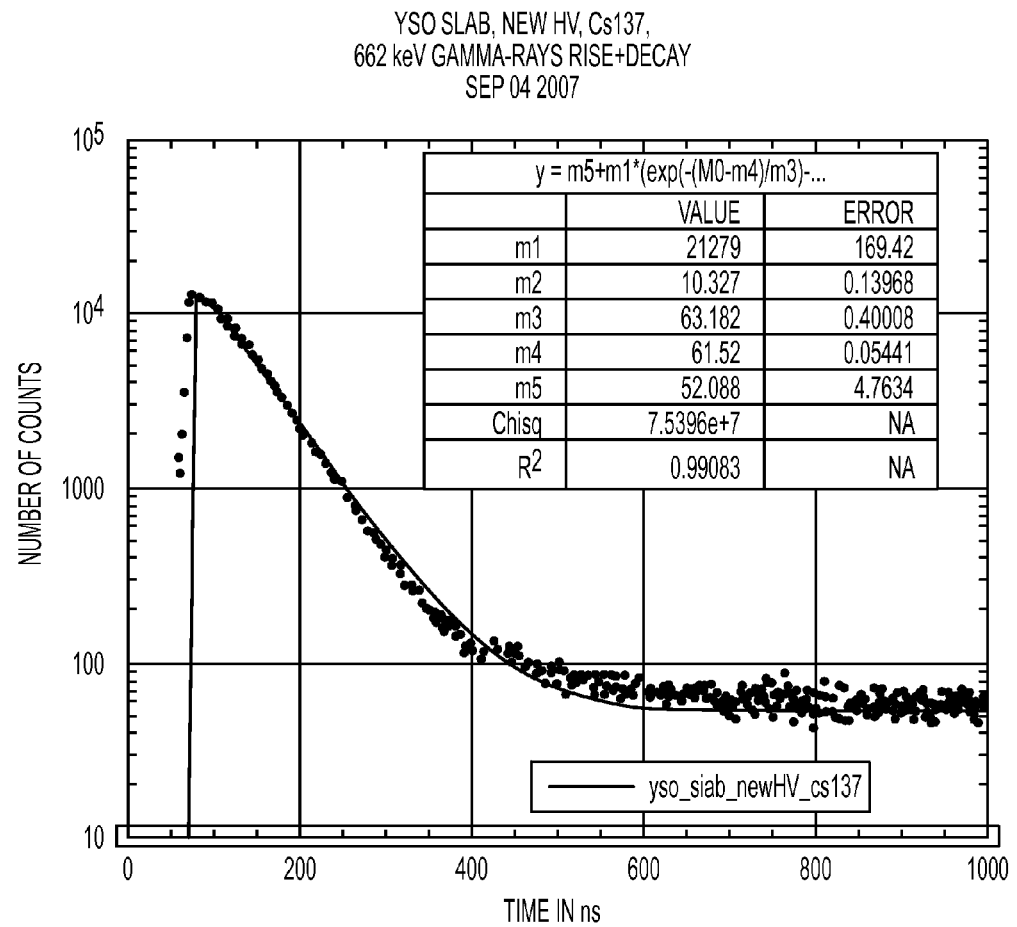
FIGS. 4A and 4B graphically illustrate the decay time for Ce:YSO without codoping and with 0.1% Ca codoping, respectively.
Figure 4B:
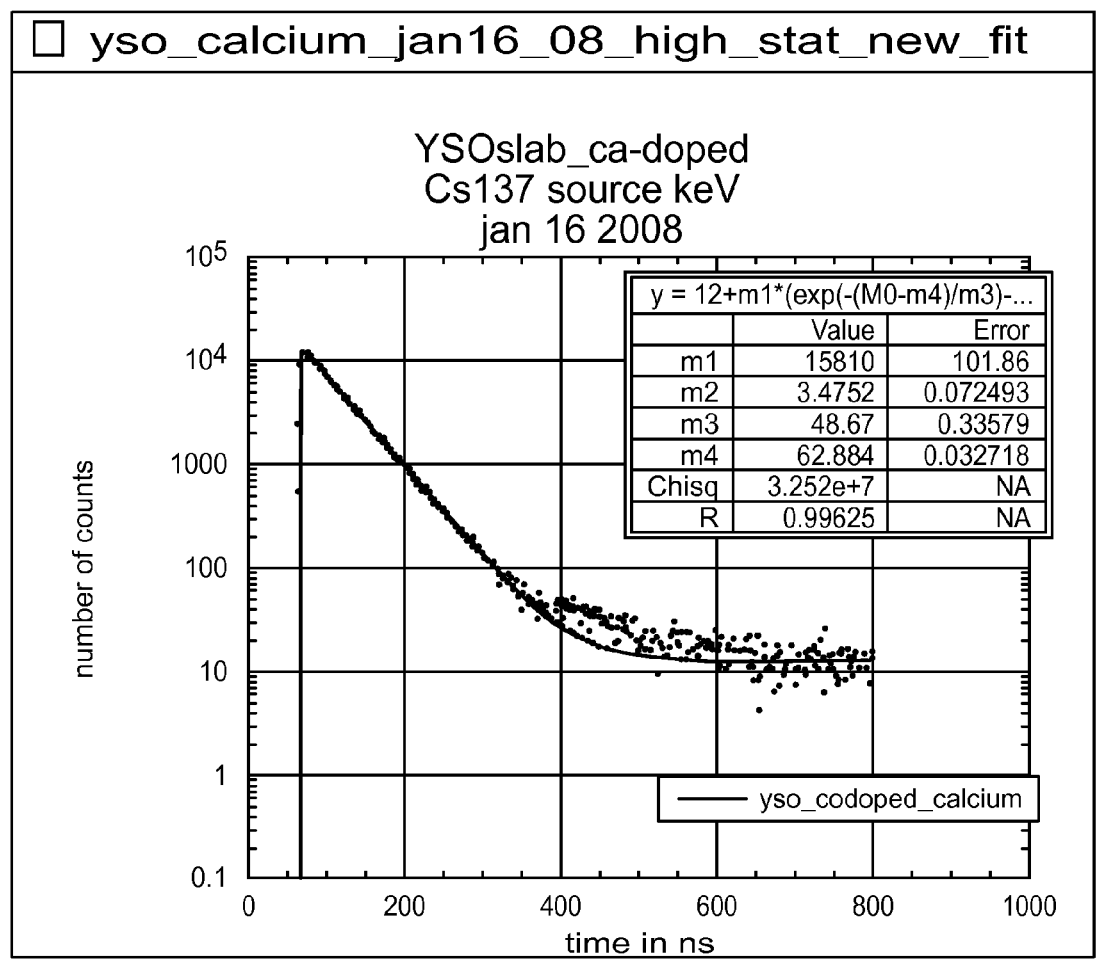

For example, Ce doped YSO was grown both with and without Ca. The concentration of Ce was 0.1 at. % in each sample, and the concentration of Cu was 0.1 at. % in one sample (i.e., a 1:1 ratio of Co to Ce), and none in another sample. From initial studies of the Ce:YSO crystals, it was found that the electron traps play a significant role by increasing the decay time and adding additional decay time components in the decay scheme. This effect was observed by measuring the decay scheme using a Bollinger-Thomas setup at room temperature and comparing it to the same measurement taken at 40K. The measurement seen at 40K showed that when the charge traps become saturated, the trap lifetimes are on the order of years and become insignificant in the decay scheme. This effect results in a shorter decay time and fewer decay time components in the decay time profile. FIGS. 4A and 4B graphically illustrate the decay time for Ce:YSO without codoping and with 0.1% Ca codoping, respectively. As shown, the decay time dropped for the sample with Ca (with a 1:1 Ca:Ce, ratio).

Figure 5:
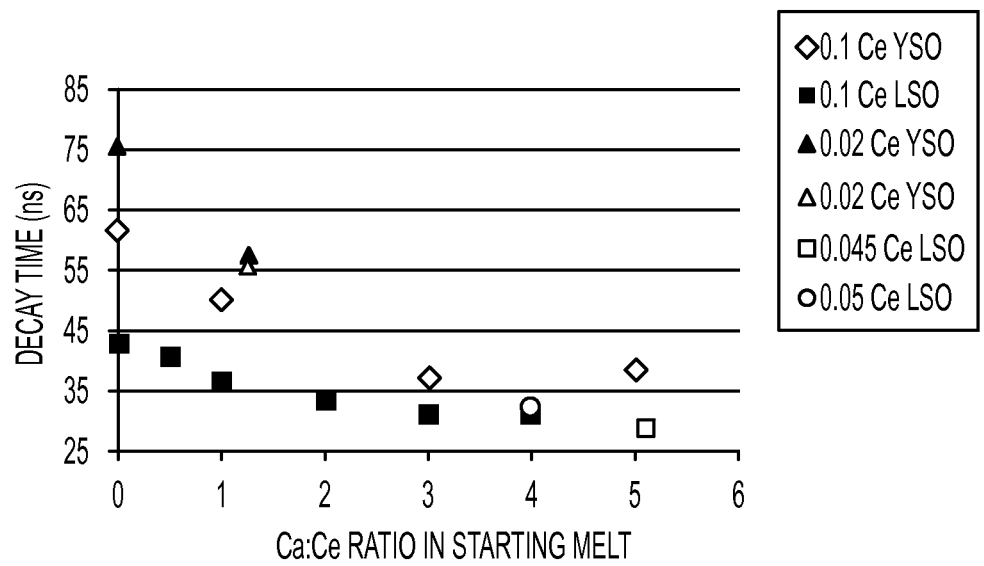
FIG. 5 graphically illustrates decay times for Ca doped Ce:LSO and Ce:YSO.

FIG. 5 shows decay times for different Ca:Ce ratios for both LSO and YSO. With the understanding that YSO normally has a longer decay time than LSO, it can be seen from FIG. 5 that YSO and LSO both respond similarly to codoping with varying Ca:Ce ratios even for different values of Ce.

Although Ce:LSO is commonly used in medical imaging, codoped Ce:YSO, Ce:GSO, Ce:LYSO, and Ce:LGSO may also be used in the medical imaging field. There are also non-medical imaging applications for these crystals. For example, Ce:GSO which is particularly useful in oil exploration may be codoped to improve the detector characteristics.

The disclosure also is not limited to Ce as the activator. Other non-cerium trivalent dopants, such as praseodymium (Pr), europium (Eu), erbium (Er), and/or Ytterbium (Yb) may be incorporated into the scintillators. For example, in accordance with another exemplary embodiment, LSO was grown doped with 0.2 atomic % Pr as an activator. One sample of the Pr:LSO was codoped with 0.2 atomic % Ca, and a second sample was not codoped. The Pr:LSO that was codoped, with about a 1:1 ratio of Ca to Pr, had an intensified color relative to the other sample with an accompanying change in absorbance spectra. Pr:YSO, Eu:YSO, Er:YSO, Nd:YSO, and Yb:YSO, which are similar in structure to Pr:LSO, are also used for lasers. These crystals may be codoped to modify the optical properties. Pr:YSO and other variants may also be used for applications such as optical data storage.

Figure 6A:
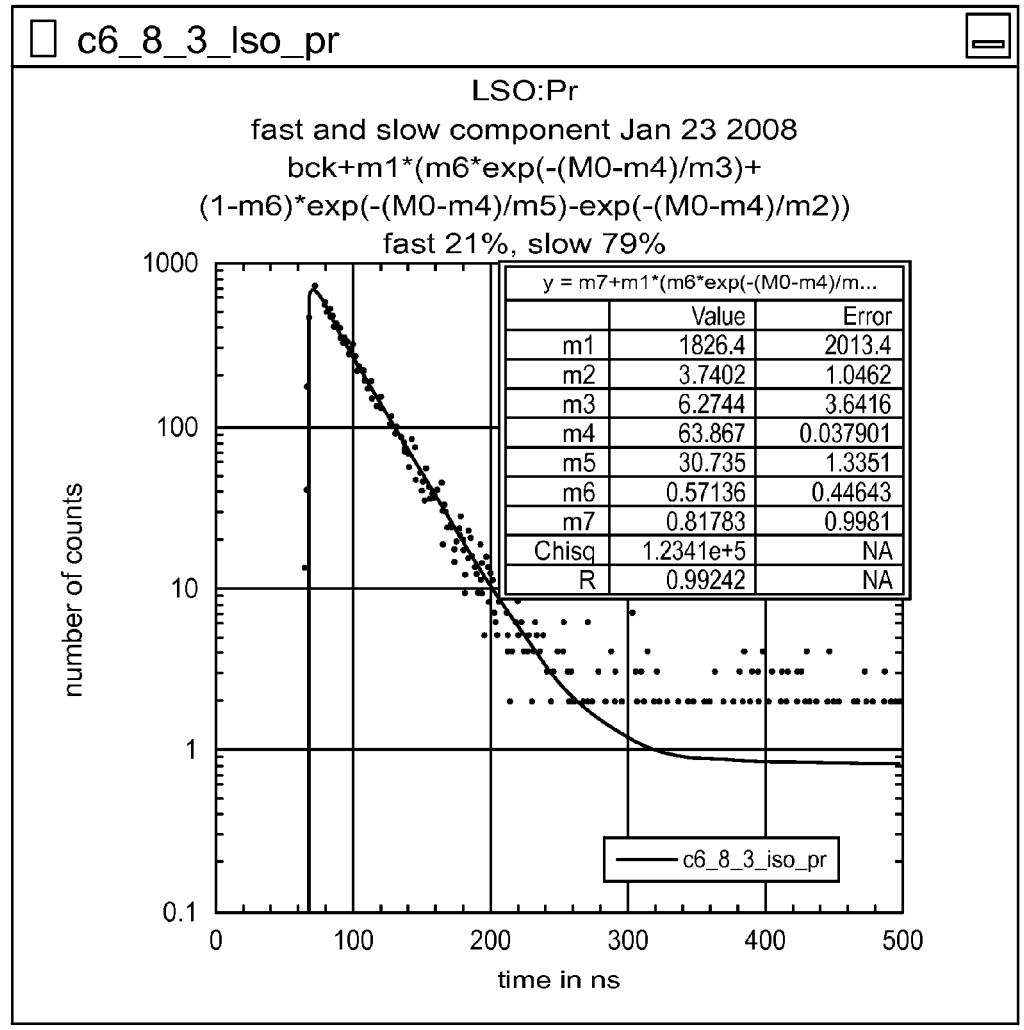
FIGS. 6A and 6B graphically illustrate decay time of Pr:LSO without codoping and with Ca in a 1:1 ratio to Pr, respectively.
Figure 6B:
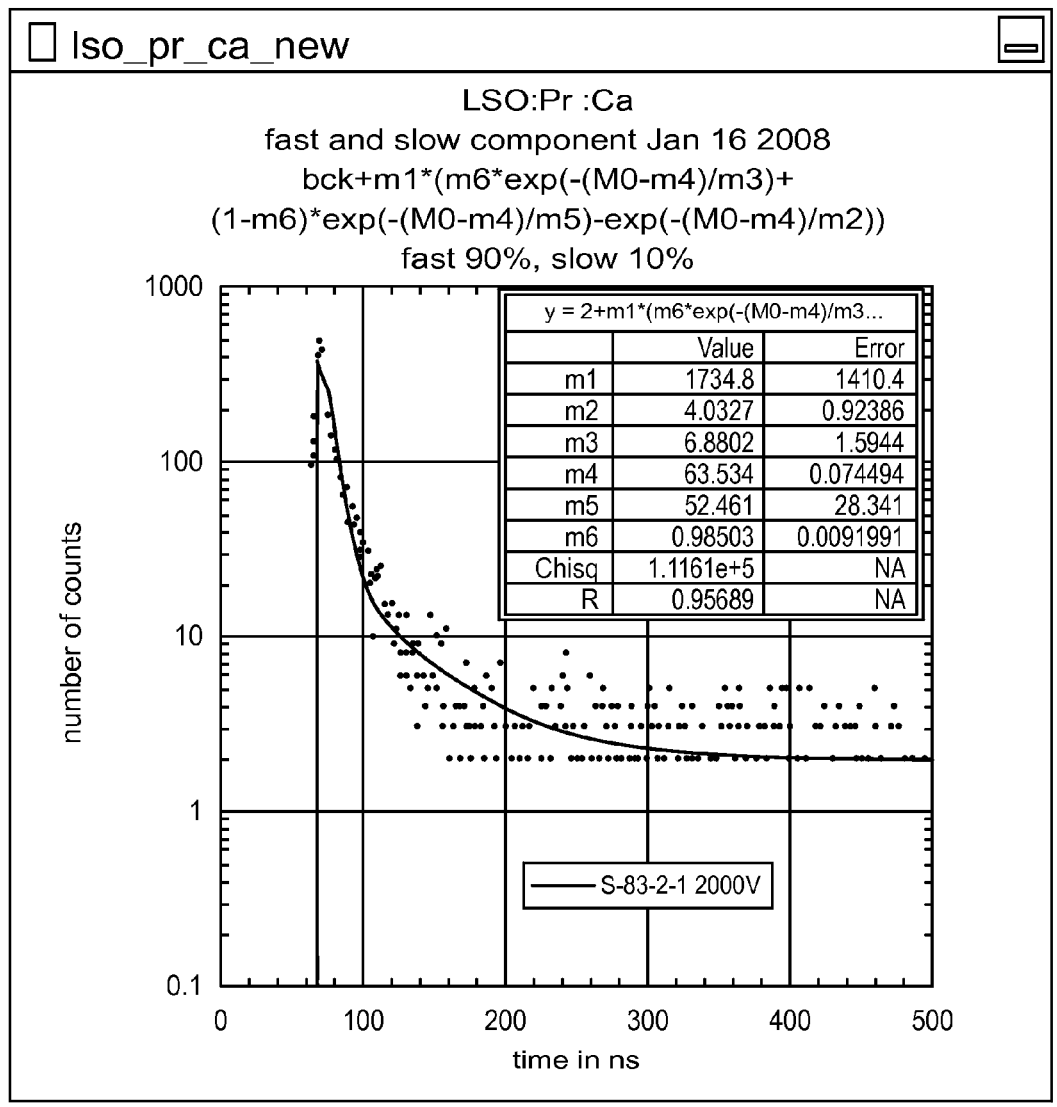

Calcium codoping also has an impact on the decay time of Pr:LSO, as shown in FIGS. 6A (not codoped) and 6B (codoped with Ca in a 1:1 ratio to Pr). The Ca codoping favors the fast component of scintillation decay, making it desirable for medical imaging. In addition, the emission spectra are modified by calcium, which appears to act as an absorber (or internal filter) for short wavelength emissions.

In addition to improving light yield and reducing decay time, codoping with monovalent and/or divalent dopants further increases the average quality of the crystals produced. Fewer crystals are grown that are out of spec. Thus, codoping with Ca, for example, is cost effective, as a higher percentage of the crystals that are grown can be used.

The embodiments of the present disclosure can achieve several technical effects, including reduced decay times, improved light yield, modified optical properties, and greater uniformity in the production of crystals. The present disclosure enjoys industrial applicability in medical imaging, oil exploration, optical data storage, lasers, and homeland security.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A scintillation material, comprising a crystal consisting essentially of:

$T_{2x}Lu_{2(1-x-y-z)}Y_{2y}Gd_{2z}SiO_5$; and at least one divalent codopant, wherein T is a trivalent activator dopant selected from the group consisting of Pr, Eu, Er and Yb, $0<2x<0.2$, $0\leq 2y\leq 2(1-x)$, $0\leq 2z\leq 2(1-x)$, and $0\leq(y+z)\leq(1-x)$, wherein the ratio (a):(b) of the divalent dopant concentration (a) to the trivalent activator dopant concentration (b) is about 1:1, to maximize light output.

2. The scintillation material according to claim 1, wherein $0\leq(y+z)<(1-x)$, such that the crystal includes Lu.

3. The scintillation material according to claim 1, wherein the divalent codopant comprises Mg, Ca, Ba, Zn, or Cu.

4. The scintillation material according to claim 3, wherein the trivalent activator dopant consists of Pr and the codopant comprises Ca.

5. A medical imaging device comprising the scintillation material according to claim 1.

6. A positron emission tomography (PET) scanner comprising the scintillation material according to claim 1.

7. A laser device comprising the scintillation material according to claim 1.

8. An oil exploration device comprising the scintillation material according to claim 1.

9. An optical data storage device comprising the scintillation material according to claim 1.

10. A scintillation detector comprising the scintillation material according to claim 1.

11. A method comprising detecting gamma rays, X-rays, cosmic rays, and particles having an energy of 1 keV or greater using the scintillation detector according to claim 10.

12. A scintillator material comprising a ceramic comprising:

$T_{2x}Lu_{2(1-x-y-z)}Y_{2y}Gd_{2z}SiO_5$; and at least one monovalent and/or divalent codopant, wherein T comprises at least one trivalent activator dopant, $0<2x<0.2$, $0\leq 2y\leq 2(1-x)$, $0\leq 2z\leq 2(1-x)$, and $0\leq(y+z)\leq(1-x)$.

13. A method comprising growing a crystal consisting essentially of:

$T_{2x}Lu_{2(1-x-y-z)}Y_{2y}Gd_{2z}SiO_5$; and at least one monovalent and/or divalent codopant, wherein T is a trivalent dopant selected from the group consisting of Pr, Eu, Er and Yb, $0 < 2x < 0.2$,
$0 \le 2y \le 2(1-x)$,
$0 \le 2z \le 2(1-x)$, and
$0 \le (y+z) \le (1-x)$, the method further comprising controlling the ratio (a):(b) of the divalent dopant concentration (a) to the trivalent activator dopant concentration (b) to about 1:1 when the codopant is divalent.

14. A scintillation material, comprising a crystal consisting essentially:

$T_{2x}Lu_{2(1-x-y-z)}Y_{2y}Gd_{2z}SiO_5$; and at least one divalent codopant, wherein T is a trivalent activator dopant selected from the group consisting of Pr, Eu, Er and Yb, $0 < 2x < 0.2$, and
$0 < 2(y+z) \le 2(1-x)$, wherein the ratio (a):(b) of the divalent dopant concentration (a) to the trivalent activator dopant concentration (b) is about 1:1, to maximize light output.

15. The scintillation material of claim 14, wherein x+y+z is substantially 1.

* * * * *